United States Patent
Oh et al.

(10) Patent No.: US 9,524,864 B2
(45) Date of Patent: Dec. 20, 2016

(54) MANUFACTURING METHOD AND FLUID SUPPLY SYSTEM FOR TREATING SUBSTRATE

(71) Applicant: Samsung Electronics Co., Ltd.

(72) Inventors: Jung-Min Oh, Incheon (KR); HyoSan Lee, Suwon-si (KR); YongSun Ko, Suwon-si (KR); KyoungSeob Kim, Suwon-si (KR); SeokHoon Kim, Seongnam-si (KR); KunTack Lee, Suwon-si (KR); YongMyung Jun, Hwaseong-si (KR); Yong-Jhin Cho, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 752 days.

(21) Appl. No.: 13/762,952

(22) Filed: Feb. 8, 2013

(65) Prior Publication Data
US 2013/0199051 A1  Aug. 8, 2013

(30) Foreign Application Priority Data
Feb. 8, 2012 (KR) .................. 10-2012-0012927

(51) Int. Cl.
*H01L 21/02* (2006.01)
*H01L 21/67* (2006.01)

(52) U.S. Cl.
CPC ... *H01L 21/02101* (2013.01); *H01L 21/67017* (2013.01); *H01L 21/67034* (2013.01)

(58) Field of Classification Search
CPC .................. H01L 21/02101; H01L 21/67017; H01L 21/67034
See application file for complete search history.

(56) References Cited

U.S. PATENT DOCUMENTS

| | | | | |
|---|---|---|---|---|
| 2,241,621 | A * | 5/1941 | Shoeld | B01D 53/14 165/116 |
| 4,765,143 | A * | 8/1988 | Crawford | F01K 3/00 60/651 |
| 5,231,835 | A * | 8/1993 | Beddome et al. | F25J 1/0015 62/615 |
| 6,703,316 | B2 | 3/2004 | Inoue et al. | |
| 8,084,367 | B2 | 12/2011 | Lee et al. | |
| 2002/0189543 | A1 * | 12/2002 | Biberger et al. | 118/715 |

(Continued)

FOREIGN PATENT DOCUMENTS

| | | |
|---|---|---|
| JP | 2010-051908 | 3/2010 |
| JP | 2011-040572 | 2/2011 |

(Continued)

*Primary Examiner* — Jiping Lu
(74) *Attorney, Agent, or Firm* — Muir Patent Law, PLLC

(57) ABSTRACT

A method of manufacture and fluid supply system for treating a substrate is provided. The fluid supply system for treating a substrate may include a substrate dry part supplying a dry fluid to dry a rinse solution doped on a substrate; a dry fluid separation part retrieving a mixed fluid that the dry fluid and the rinse solution are mixed with each other during a dry process of the substrate from the substrate dry part and separating the dry fluid from the mixed fluid; and a dry fluid supply part resupplying the dry fluid separated from the dry fluid separation part to the substrate dry part.

10 Claims, 8 Drawing Sheets

(56) References Cited

U.S. PATENT DOCUMENTS

| | | | |
|---|---|---|---|
| 2003/0172954 A1* | 9/2003 | Verhaverbeke | B08B 3/12 134/1.3 |
| 2004/0221875 A1 | 11/2004 | Saga et al. | |
| 2005/0000244 A1* | 1/2005 | Wikstrom | B01D 53/00 62/606 |
| 2008/0004194 A1* | 1/2008 | McDermott | H01L 21/02101 510/175 |
| 2008/0063493 A1 | 3/2008 | Cho et al. | |
| 2010/0037518 A1* | 2/2010 | Tsang | C10J 3/466 48/76 |
| 2012/0048304 A1* | 3/2012 | Kitajima et al. | 134/30 |

FOREIGN PATENT DOCUMENTS

| | | |
|---|---|---|
| KR | 10-2002-0027749 A | 4/2002 |
| KR | 10-2005-0032943 A | 4/2005 |
| KR | 10-2007-0076992 A | 7/2007 |
| KR | 10-2010-0103120 A | 9/2010 |
| KR | 10-2011-0080967 A | 7/2011 |

\* cited by examiner

MANUFACTURING METHOD AND FLUID SUPPLY SYSTEM FOR TREATING SUBSTRATE

CROSS-REFERENCE TO RELATED APPLICATIONS

This U.S. non-provisional patent application claims priority under 35 U.S.C. §119 of Korean Patent Application No. 10-2012-0012927, filed on Feb. 8, 2012, the entire contents of which are hereby incorporated by reference.

BACKGROUND

The present inventive concept herein relates to fluid supply systems and methods of using the system, and more particularly, to a fluid supply system for treating a substrate and a method of manufacturing using the system.

A manufacturing process of semiconductor device may include a cleaning processing removing pollutants remaining on a substrate. The cleaning process may comprise a chemical process, a rinse process and a dry process sequentially performed. The cleaning process is a process may supply a chemical to remove pollutants on a substrate. The rinse process may provide a rinse solution to remove a chemical on a substrate. The dry process may be a process to dry a rinse solution remaining on a substrate.

The dry process may dry a rinse solution on a substrate that is deposited on the substrate using a supercritical fluid. Carbon dioxide is often used as the supercritical fluid. However, there are economical and environmental limits in using carbon dioxide.

SUMMARY

Embodiments of the inventive concept provide a fluid supply system for treating a substrate. The fluid supply system for treating a substrate may include a substrate dry part supplying a dry fluid to dry a rinse solution doped on a substrate; a dry fluid separation part retrieving a mixed fluid that the dry fluid and the rinse solution are mixed with each other during a dry process of the substrate from the substrate dry part and separating the dry fluid from the mixed fluid; and a dry fluid supply part resupplying the dry fluid separated from the dry fluid separation part to the substrate dry part.

Embodiments of the inventive concept also provide a fluid supply manufacturing method for treating a substrate. The method for treating a substrate may include a substrate dry step supplying a dry fluid to dry a rinse solution doped on a substrate; a dry fluid separation step retrieving a mixed fluid that the dry fluid and the rinse solution are mixed with each other in the substrate dry step and separating the dry fluid from the retrieved mixed fluid; and a dry fluid supply step resupplying the dry fluid separated from the mixed fluid to the substrate.

In some examples, a fluid supply system for treating a substrate may comprise a chamber configured to supply a dry fluid to a substrate to dry a rinse solution adhered to a substrate; a dry fluid separation unit configured to receive a mixed fluid comprising a mixture of the dry fluid and the rinse solution from the chamber and configured to separate at least a portion of the dry fluid from the mixed fluid; and a dry fluid supply part configured to resupply the separated dry fluid to the chamber.

The mixed fluid may be maintained at a first pressure in the chamber.

The dry fluid separation unit may comprise a first separation part configured to reduce the pressure of the mixed fluid to a second pressure lower than the first pressure to change the phase of the dry fluid included in the mixed fluid to a phase different from the rinse solution and to perform an initial separation of the phase-changed dry fluid from the rinse solution to obtain an initially separated phase-changed dry fluid; and a second separation part configured to receive the initially separated phase-changed dry fluid and to pass the initially separated phase-changed dry fluid dry fluid through an absorbent to perform a secondary separation of the dry fluid from the rinse solution.

The absorbent may comprise zeolite.

The first separation part may comprise a separation tank including an interior space to receive the mixed fluid from the chamber; a discharge pipe having an inlet connected to a bottom surface of the separation tank to remove rinse solution separated from the dry fluid to an outside of the separation tank; a retrieve pipe configured to retrieve the dry fluid separated from the rinse solution, a retrieve inlet of the retrieve pipe being connected to the separation tank at a higher position than the inlet of the discharge pipe; and a heater configured to heat the inside of the separation tank, the heater being installed in the separation tank.

The second separation part may comprise an absorption container in which an absorbent is provided; and a cooling member configured to cool the inside of the absorption container, the cooling member being installed in the absorption container.

The second separation part may comprise a first absorption container in which a first portion of the absorbent is provided; a second absorption container in which a second portion of the absorbent is provided; a retrieve pipe configured to retrieve the dry fluid separated from the first separation part, wherein one end of the retrieve pipe may be connected to the first separation part and the other end is split into a first outlet and a second outlet and connected to the first absorption container with the first outlet and the second absorption container with the second outlet; a fluid supply control part configured to selectively supply the dry fluid to one of the first absorption container and the second absorption container, the fluid supply control part being installed at the retrieve pipe; a detector configured to measure purity of the dry fluid being discharged from the first absorption container and the second absorption container; and a controller configured to analyze impurities of the dry fluid in response to data provided from the detection part and to control the fluid supply control part so that the dry fluid is supplied to one of the first and second absorption containers when it is determined that the other of the first and second absorption containers has unacceptable impurities.

The dry fluid supply unit may comprise a liquefier configured to liquefy the dry fluid separated in the second separation part; a storage tank configured to receive and to store the liquefied dry fluid, the storage tank being connected to the liquefier; and a cooler configured to remove heat from the inside of the storage tank.

The dry fluid supply part may comprise a meter configured to monitor an of the dry fluid stored in the storage tank; and an auxiliary fluid supply part configured to supply auxiliary dry fluid to the storage tank if the stored dry fluid is less than a predetermined amount.

The auxiliary fluid supply part may comprise an auxiliary fluid storage unit storing the auxiliary fluid; an auxiliary fluid supply line connecting the auxiliary fluid storage unit and the liquefier and configured to supply the auxiliary dry fluid to the liquefier; and a refinement part configured to remove impurities included in the auxiliary dry fluid supplied to the liquefier, the refinement part being installed at the auxiliary fluid supply line.

The dry fluid supply part may comprise a supply pipe connecting the storage tank and the chamber and configured to supply the dry fluid stored in the storage tank to the chamber; and a pump increasing a pressure of the dry fluid to a first pressure, the pump being installed at the supply pipe.

A method of manufacture may comprise supplying a dry fluid to dry a rinse solution provided on a substrate, the supplying creating a mixed fluid comprising a mixture of the dry fluid and the rinse solution; retrieving the mixed fluid comprising a mixture of the dry fluid and the rinse solution and separating the dry fluid from the retrieved mixed fluid; and resupplying the dry fluid separated from the mixed fluid to the substrate.

Mixed fluid may be maintained at a first pressure when supplying the dry fluid to dry a rinse solution.

Separating the dry fluid may comprise a first separation step comprising decompressing the mixed fluid to a second pressure lower than the first pressure to phase-change the dry fluid included in the mixed fluid to a phase different from a phase of the rinse solution and then, performing a first separation of the decompressed mixed fluid to separate the phase-changed dry fluid from at least some of the rinse solution; and a second separation step comprising passing the separated dry fluid through an absorbent to perform a second separation of the dry fluid from the rinse solution.

The absorbent may be sequentially provided to a first absorption container and a second absorption container connected to each other in parallel. The second separation step may selectively supply the firstly separated dry fluid to one of the first and second absorption containers, measures impurities of the dry fluid being discharged out of the absorption container to which the dry fluid is supplied and if impurities are detected from the dry fluid in the one absorption container of the first and second absorption containers, supplies the dry fluid to the other absorption container of the first and second absorption containers.

Resupplying the dry fluid may comprise liquefying the dry fluid separated in the second separation step; storing the liquefied dry fluid in a storage tank as much as a previously set up flow; and pressurizing the dry fluid stored in the storage tank to the first pressure.

The dry fluid used in the substrate dry step may be carbon dioxide having a supercritical state. The absorbent may include zeolite.

A method of manufacture may comprise processing a semiconductor wafer to create an integrated circuit with the semiconductor wafer, the processing may comprise forming a layer on the semiconductor wafer; patterning the layer on the semiconductor wafer; cleaning the patterned layer on the semiconductor wafer; rinsing the patterned layer on the semiconductor wafer by providing a rinsing solution to the semiconductor wafer; drying the rinsed patterned layer on the semiconductor layer by providing supercritical carbon dioxide to the semiconductor wafer within a processing chamber, creating a mixed fluid of supercritical carbon dioxide and rinse solution within the processing chamber; removing the mixed fluid of supercritical carbon dioxide and rinse solution from the processing chamber; reducing the pressure of the mixed fluid to a pressure at which a supercritical carbon dioxide portion of the mixed fluid has a gas state and at which the rinse solution has a liquid state to thereby separate liquid rinse solution from the mixed fluid and obtain a carbon dioxide remaining gas; filtering the carbon dioxide remaining gas to remove impurities; and converting the filtered carbon dioxide remaining gas to supercritical carbon dioxide to thereby allow reuse of the carbon dioxide as a drying agent.

After filtering the carbon dioxide remaining gas, the filtered carbon dioxide remaining gas may be converted to liquid carbon dioxide and stored the liquid carbon dioxide in a storage tank.

The method may further comprise monitoring a level of liquid carbon dioxide in the storage tank, detecting a low level of liquid carbon dioxide in the storage tank, and adding auxiliary liquid carbon dioxide from secondary source to the storage tank.

The cleaning and rinsing may be performed within the same processing chamber.

Filtering the carbon dioxide remaining gas to remove impurities may comprise passing the carbon dioxide remaining gas through a first absorption filter; monitoring an output of carbon dioxide remaining gas output from the first absorption filter for impurities; and switching a flow path of the carbon dioxide remaining gas to pass through a second absorption filter and to stop passing through the first absorption filter when the monitoring indicates a level of impurities exceed a first value.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
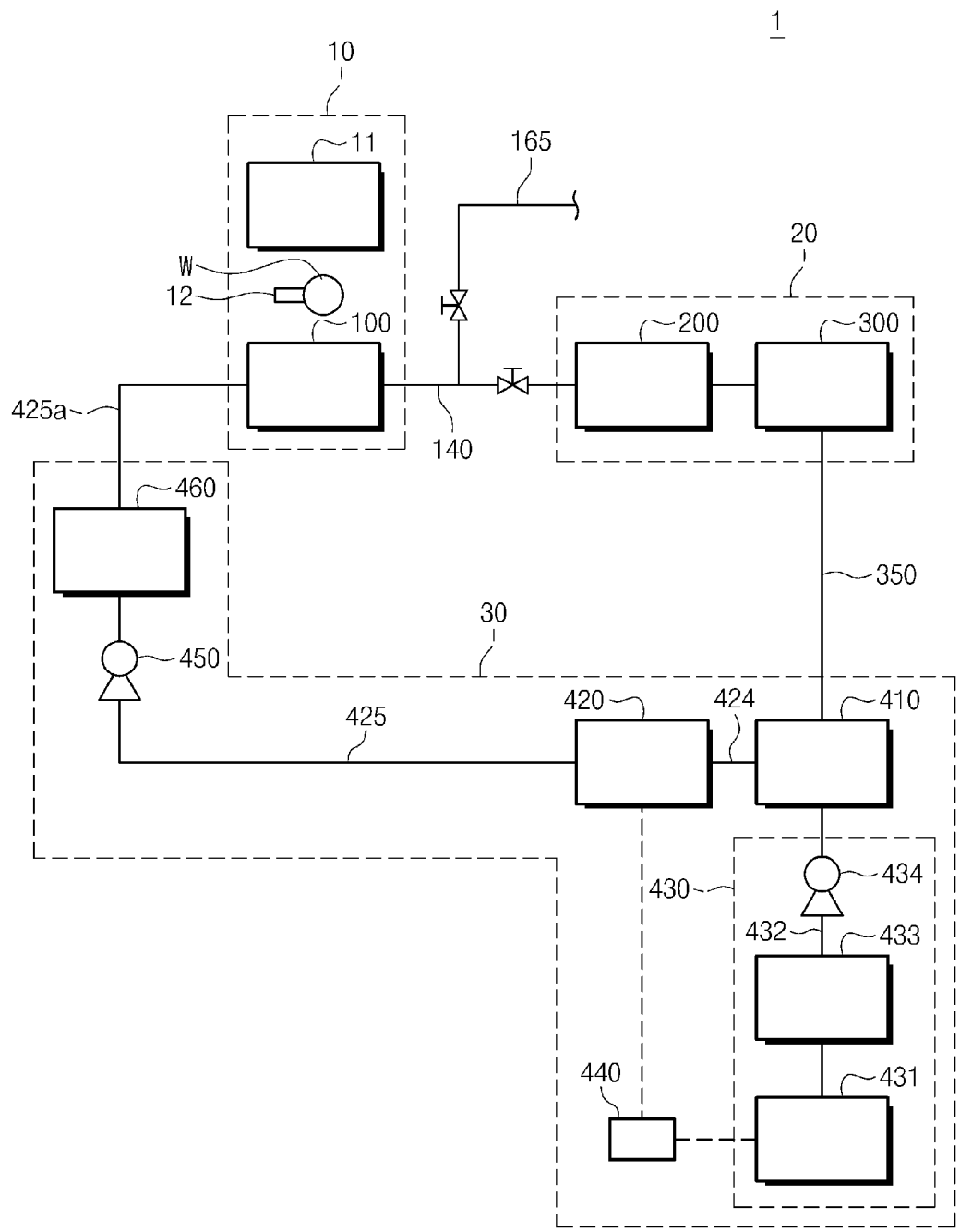
FIG. 1 is a drawing illustrating a fluid supply system for treating a substrate in accordance with certain embodiments of the inventive concept.

Embodiments of inventive concepts will be described more fully hereinafter with reference to the accompanying drawings, in which some exemplary embodiments of the invention are shown. This inventive concept may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a drawing illustrating a fluid supply system for treating a substrate in accordance with certain embodiments of the inventive concept.

Referring to FIG. 1, a fluid supply system 1 performs a cleaning process, a rinse process and a dry process, and may reprocess and resupply chemical solution(s) used in one or more of these processes. The fluid supply system 1 includes a substrate treatment part 10, a dry fluid separation part 20 and a dry fluid supply part 30. The substrate treatment part 10 sequentially performs a cleaning process, a rinse process and a dry process on a substrate W. The substrate W may be comprise a semiconductor wafer which may include a semiconductor base substrate and one or more layers (such as patterned conductive layers and patterned dielectric layers) to form circuitry on and/or within the wafer. The dry fluid separation part 20 separates dry fluid used in a dry process from other fluids and reprocesses it. The dry fluid supply part 30 resupplies the reprocessed dry fluid in the dry fluid separation part 20 to a substrate dry part 100.

The substrate treatment part 10 includes a substrate cleaning part 11, a substrate transfer part 12 and the substrate dry part 100.

The substrate cleaning part 11 performs a cleaning process and a rinse process on the substrate W. The cleaning process supplies a cleaning solution to remove pollutants attached to the substrate W. The rinse process supplies a rinse solution onto the substrate to remove a cleaning solution remaining on the substrate W. In the rinse process, the substrate W is provided with a rinse solution. Examples of the rinse solution are DI water, isopropyl alcohol (IPA), ethanol and methanol.

The substrate transfer part 12 is disposed between the substrate cleaning part 11 and the substrate dry part 100. The substrate transfer part 12 transfers the substrate W on which a rinse process is completed to the substrate dry part 100. The substrate W is transferred with the rinse solution remaining thereon. The substrate transfer part 12 may include a transfer robot having a hand that supports (or other end effector that carries) the substrate W.

The substrate dry part 100 supplies a dry fluid to remove a rinse solution doped on the substrate W. The substrate dry part 100 is configured to dry the substrate W using a dry fluid having a supercritical condition. The dry fluid having a supercritical condition removes the rinse solution remaining on the substrate W. Carbon dioxide $CO_2$ may be used as the dry fluid.

Figure 2:
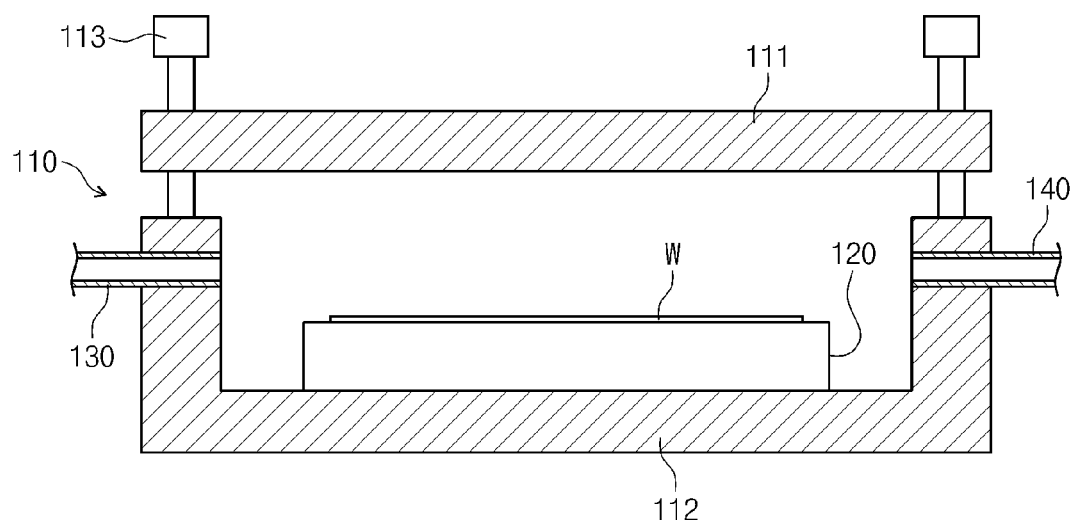
FIG. 2 is a cross sectional view illustrating a substrate dry part of FIG. 1 in accordance with certain embodiments of the inventive concept.

FIG. 2 is a cross sectional view illustrating a substrate dry part 100 of FIG. 1 in accordance with certain embodiments of the inventive concept. Referring to FIGS. 1 and 2, the substrate dry part 100 includes a process chamber 110, a substrate support member 120, a supply port 130 and a fluid supply pipe 140.

The process chamber 110 provides a space in which a dry process is performed. The process chamber 110 is provided to include a material that can be endurable against a critical pressure and a critical temperature of dry fluid. The process chamber 110 may be provided to have a structure in which an upper chamber 111 and a lower chamber 112 are combined with each other. By driving a chamber moving part 113, one or both of the upper and lower chambers 111 and 112 may move up and down to shrink or enlarge the size of the inside of the process chamber 110. The process chamber 110 may be opened when the substrate W is carried into or carried out of the process chamber 110 and is closed while a dry process is performed.

A heater (not shown) may be buried in a sidewall of the process chamber 110. The heater may heat the inside of the process chamber 110 so that an internal temperature of the process chamber 110 is maintained above a critical temperature.

The substrate support member 120 is located inside the process chamber 110 and supports the substrate W. The substrate support member 120 may be an electrostatic chuck fixing the substrate W using electrostatic force, a vacuum chuck fixing the substrate W using a vacuum or a chuck that a plurality of pins mechanically fixes the substrate W for example.

The supply port 130 supplies a dry fluid having a supercritical condition to the inside of the process chamber 110. The supercritical dry fluid is supplied from the dry fluid supply part 30 to the supply port 130 and then into the inside of process chamber 110. The dry fluid supplied to the inside of the process chamber 110 is diffused and may act to increase an internal pressure of the process chamber 110. The dry fluid dissolves a rinse solution doped on the substrate W. While this dry process is performed, the inside of the process chamber 110 may be maintained at a first pressure and a first temperature. The first pressure and the first temperature may be selected to maintain the dry fluid at a supercritical condition, and may be close to a critical pressure and a critical temperature of carbon dioxide, respectively. For instance, the first pressure may be about 100~200 bar and the first temperature may be about 40~80° C.

The fluid supply pipe 140 is supplied from the process chamber 110 with a mixed fluid comprising a rinse solution dissolved into a dry fluid. The fluid supply pipe 140 supplies the mixed fluid to the first separation part 200 of the dry fluid separation part 20. A fluid discharge pipe 165 may connect to the fluid supply pipe 140. The fluid discharge pipe 165 may discharge the mixed fluid to the outside of the fluid supply system 1 in case discarding dry fluid is desired.

The mixed fluid retrieved from the process chamber 110 of the substrate dry part 100 is supplied to the first separation part 200 of the dry fluid separation part 20. The retrieved mixed fluid may have a temperature and pressure to maintain the dry fluid in a super critical state in fluid supply pipe 140. For example, the retrieved mixed fluid may be maintained at the first pressure and the first temperature in fluid supply pipe 140. The dry fluid separation part 20 includes a first separation part 200 and a second separation part 300.

The first separation part 200 and the second separation part 300 separate the dry fluid from the mixed fluid. The first separation part 200 and the second separation part 300 are serially connected to each other to sequentially separate a dry fluid. The first separation part 200 performs an initial separation of the dry fluid from the mixed fluid, and the second separation part 300 performs an additional separation of the dry fluid from the output of the first separation part 200. The first separation part 200 reduces a pressure of the mixed fluid from the first pressure to a second pressure to phase-change the dry fluid and the rinse solution included in the mixed fluid, and then separate them. The second pressure is lower than the critical pressure of dry fluid. The second separation part 300 performs a further separation of the dry fluid provided by the first separation part 200 by passing it through an absorbent.

Figure 3:
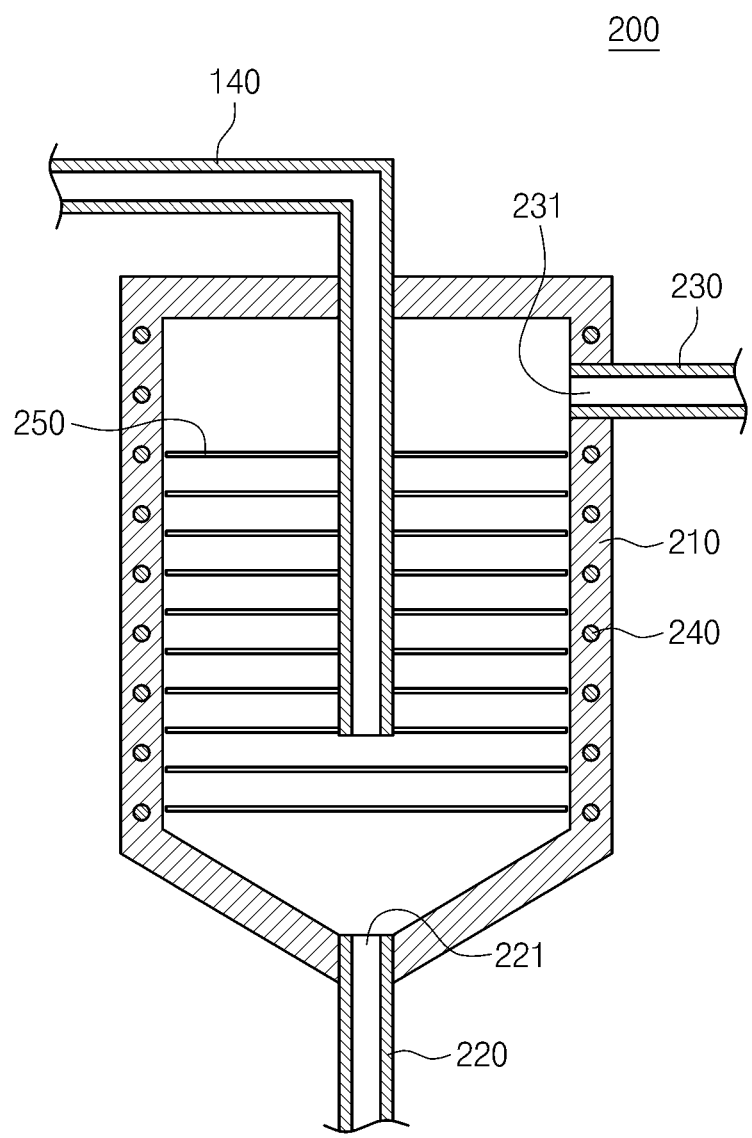
FIG. 3 is a cross sectional view illustrating a first separation part of FIG. 1.

FIG. 3 is a cross sectional view illustrating a first separation part of FIG. 1.

Referring to FIG. 3, the first separation part 200 includes a separation tank 210, a discharge pipe 220, a retrieve pipe 230 and a heater 240.

The separation tank 210 has a space formed therein. A lower wall of the separation tank 210 gradually extends outwardly and upwardly from the bottom of the separation tank 210. The lower wall of the separation tank 210 may have a funnel shape. An end of the fluid supply pipe 140 is connected to and may be located inside the separation tank 210. An internal space of the separation tank 210 may have a relatively larger volume than the process chamber 110 of the substrate dry part 100 and the fluid supply pipe 140. When the mixed fluid is discharged to the inside of the separation tank 210, the volume of the mixed fluid expands and a pressure of the mixed fluid is reduced to the second pressure. In case of carbon dioxide, the second pressure may be about 20~60 bar. In this process, the dry fluid evaporates becoming a gas and is separated from the rinse solution that has liquid state. The rinse solution drops to a lower part of the separation tank 210 due to gravity and the dry fluid moves to an upper part of the separation tank 210.

The discharge pipe 220 and the retrieve pipe 230 are connected to the separation tank 210. A discharge inlet 221 of the discharge pipe 220 is connected to the separation tank 210 at the center of the funnel shaped bottom walls of the separation tank 210. The rinse solution may collect in the lower part of the separation tank 210 and be discharged to the outside of the separation tank 210 through the discharge pipe 220. A shape of bottom interior surface of the separation tank 210 is formed so that the rinse solution flows to the discharge inlet 221 of the discharge pipe 220. The retrieve pipe 230 is connected to the separation tank 210 at a higher position than the discharge pipe 220. The retrieve pipe 230 may be installed on a sidewall or top cover of the separation tank 210. A retrieve inlet 231 of the retrieve pipe 230 is located at a higher position than the discharge inlet 221 of the discharge pipe 220. The dry fluid in its gas state within the separation tank 210 may be retrieved through the retrieve pipe 230 and be supplied to the second separation part 300.

The heater 240 is buried in a sidewall of the separation tank 210. The heater 240 may act to prevent an internal temperature of the separation tank 210 from being lowered to an undesirable temperature when the dry fluid evaporates. If the inside of the separation tank 210 remains at too low of a temperature, evaporation of the dry fluid may be suppressed. As a result, the separation of the dry fluid from the rinse solution may be more difficult. The heater 240 heats the separation tank 210 to maintain the inside of the separation tank 210 at a proper temperature. The inside of the separation tank 210 can be maintained at a room temperature. The inside of the separation tank 210 may be made higher or lower than the dry fluid temperature in its supercritical state. Under the above temperature condition, the dry fluid evaporates more easily separated from the rinse solution.

Mesh 250 may be provided within the separation tank 210. The mesh 250 may be comprised of several stacked layers in the inside of the separation tank 210. The mesh 250 may be adjacent to the end of the fluid supply pipe 140. One or more layers of the mesh 250 may each surround the end of the fluid supply pipe 140 so that the fluid supply pipe 140 extends through the mesh layer at a center portion of the mesh layer. Exterior portions of the mesh layer may extend to and contact interior sidewalls of the separation tank 210.

Figure 4:
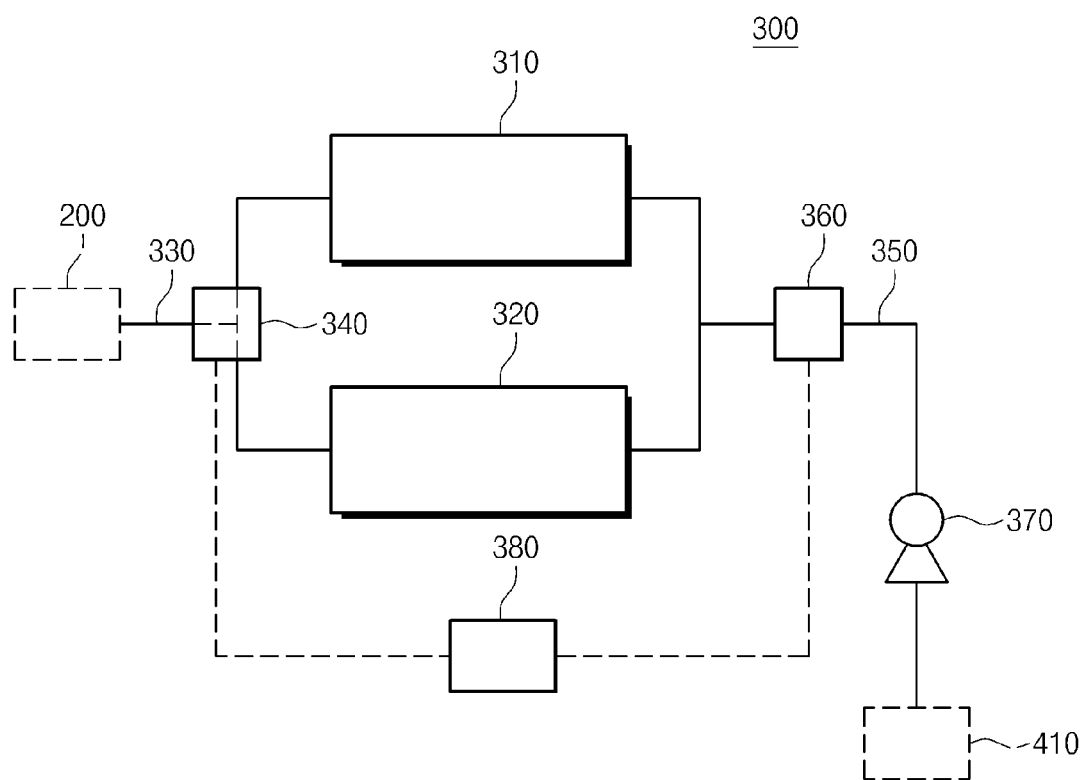
FIG. 4 is a cross sectional view illustrating a second separation part of FIG. 1.

FIG. 4 is a cross sectional view illustrating a second separation part 300 of FIG. 1.

Referring to FIGS. 1 and 4, the dry fluid provided by the first separation part 200 by retrieve pipe 330 (which may be the same as retrieve pipe 230 or in fluid communication with retrieve pipe 230) may include a small amount of rinse solution. The second separation part 300 separates the rinse solution included in the dry fluid. The second separation part 300 includes a first absorption unit 310, a second absorption unit 320, a retrieve pipe 330, a fluid supply control part 340, a discharge pipe 350, a detector 360, a pump 370 and a control part 380.

The first absorption unit 310 and the second absorption unit 320 are disposed in parallel. The first absorption unit 310 and the second absorption unit 320 may have the same structure. A specific structure of the first and second absorption units 310 and 320 will be described in detail in FIG. 5.

The retrieve pipe 330 supplies a dry fluid retrieved from the first separation part 200 to the first and second absorption units 310 and 320. One end of the retrieve pipe 330 is connected to the first separation part 200 and two other ends of the retrieve pipe 330 each branch off to be connected to the first and second absorption units 310 and 320, respectively. The retrieve pipe 330 and the retrieve pipe 230 of the first separation part 200 may be the same or in fluid communication with one another.

The fluid supply control part 340 is installed at junction of the retrieve pipe 330. The fluid supply control part 340 controls a flow of dry fluid so that the dry fluid is selectively supplied to any one of the first and second absorption units 310 and 320, according to the selection. The fluid supply control part 340 may comprise a three-way valve.

First and second ends of discharge pipe 350 are respectively connected to the first and second absorption units 310 and 320, respectively. The dry fluid discharged from the first and second absorption units 310 and 320 is delivered to the discharge pipe 350 via first and second ends, respectively. The discharge pipe 350 merges downstream from its first and second ends to a singular body.

The detector 360 and the pump 370 are sequentially installed downstream within the discharge pipe 350. The detector 360 is installed between the junction (here, the "T") of the discharge pipe 350 and the pump 370. The detector 360 measures purity of dry fluid being discharged from the first and/or second absorption units 310 and 320 respectively. Measured data is provided to the control part 380 by the detector 360. The control part 380 controls the fluid supply control part 340 on the basis of the data provided from the detector 360. For instance, when the dry fluid is supplied to the first absorption unit 310 and is not supplied to the second absorption unit 320, the detector 360 measures purity of the dry fluid discharged from the first absorption unit 310. If impurities are detected or an unacceptable amount of impurities (e.g., greater than X ppm) in the dry fluid, the control part 380 controls the fluid supply control part 340 so that the dry fluid is not supplied to the first absorption unit 310 and is supplied to the second absorption unit 320. Such detection of impurities by the detector 360 may indicate that separation efficiency of dry fluid in the first absorption unit 310 is deteriorated. The control part 380 controls the fluid supply control part 340 so that the dry fluid is supplied to the second absorption unit 320 and not the first absorption unit 310. During the period in which the dry fluid is not supplied to the first absorption unit 310, absorbent 312 within absorption unit 310 may be replaced. Similarly, when the dry fluid is not supplied to the second absorption unit 320, absorbent 312 within absorption unit 320 may be replaced. As a result, separation of the dry fluid in the second separation part 300 can be continuously performed.

The pump 370 increases a pressure to a high pressure before the dry fluid is supplied to a liquefier 410. The pump 370 can increase a pressure of the dry fluid to a pressure of liquefaction so that the dry fluid changes from its gas state to a liquid state.

Figure 5:
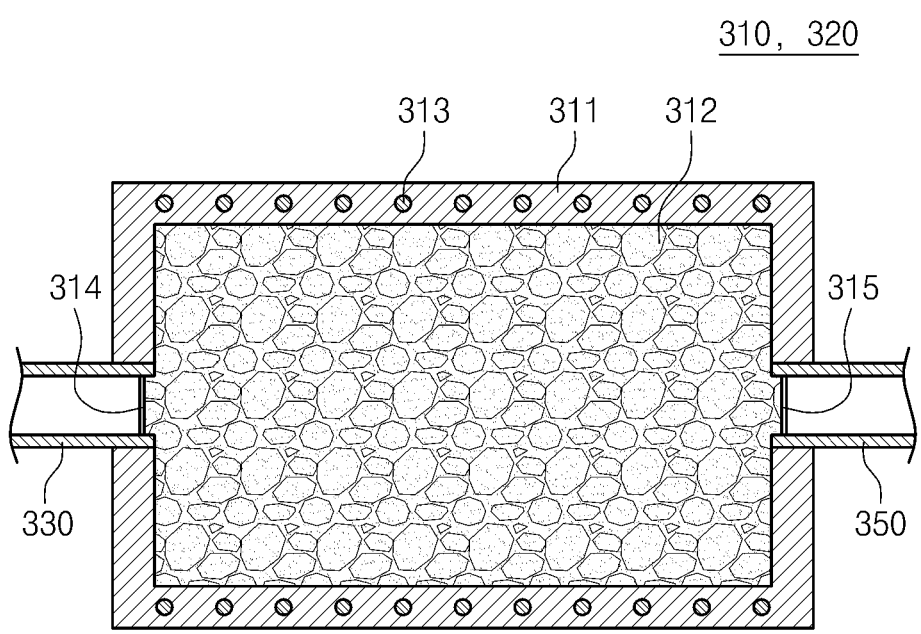
FIG. 5 is a cross sectional view illustrating first and second absorption units of FIG. 4.

FIG. 5 is a cross sectional view illustrating first and second absorption units of FIG. 4.

Referring to FIG. 5, first and second absorption units 310 and 320 includes an absorption container 311, an absorbent 312, a cooling member 313 and meshes 314 and 315 respectively.

A space is formed in the inside of the absorption container 311. The retrieve pipe 330 connects with a front end of the absorption container 311 and the discharge pipe 350 is connected to a back end of the absorption container 311. The absorbent 312 is provided within the absorption container 311. The absorbent 312 is a material that may absorb gas or molecules of a solution so that gas or molecules of a solution cling to a surface of the absorbent 312. The absorbent 312 may be porous. The porous absorbent 312 may have a large surface area per unit volume in order to absorb a large amount of fluid. Zeolite may be used as the absorbent 312. Activated carbon, diatomite, silica gel, bentonite and alumina may be used as the absorbent 312. While the dry fluid passes through the absorbent 312, rinse solution included with the dry fluid is absorbed by absorbent 312, and may cling to a surface of the absorbent 312. After removal of the rinse solution by absorbent 312, the remaining dry fluid is discharged through the discharge pipe 350.

The cooling member 313 is buried in the absorption container 311. The cooling member 313 may be buried in a top wall and a bottom wall of the absorption container 311 respectively. The cooling member 313 may wrap around (e.g., spiral around) the walls of the absorption container 311. The cooling member 313 may maintain a constant internal temperature of the absorption container 311. Heat may be produced while the rinse solution is absorbed onto the absorbent 312. An increase of internal temperature of the absorption container 312 due to heat generation may reduce an absorptive power of the absorbent 312. The cooling member 313 cools the inside of the absorption container 311 to suppress a rise in temperature due to heat generation and thereby promote absorption of the absorbent 312. The cooling member 313 may be provided in the form of a pipe in which a path through which refrigerant flows is formed.

The meshes 314 and 315 may be installed at back end of the retrieve pipe 330 and a front end of the discharge pipe 350 respectively. The meshes 314 and 315 prevent the absorbent 312 from moving into the retrieve pipe 330 and the discharge pipe 350.

Referring back to FIG. 1, the dry fluid separated from the dry fluid separation part 20 is supplied to the dry fluid supply part 30 in a high pressure state. The dry fluid supply part 30 may store the dry fluid in a liquid state and may resupply the stored dry fluid to the substrate dry part 100 in a supercritical condition. The dry fluid supply part 30 may comprise a liquefier 410, a fluid storage part 420, an auxiliary fluid supply part 430, a control part 440, a high pressure pump 450 and a reserve unit 460.

In this example, the liquefier 410 is connected to the discharge pipe 350. The liquefier 410 cools the dry fluid to liquefy it. The liquefier 410 cools the dry fluid at a temperature that the pressurized dry fluid can maintain a liquid state. The storage part 420 is connected to the liquefier 410 through a pipe. The fluid storage part 420 stores liquefied dry fluid received from the liquefier 410 through the pipe.

Figure 6:
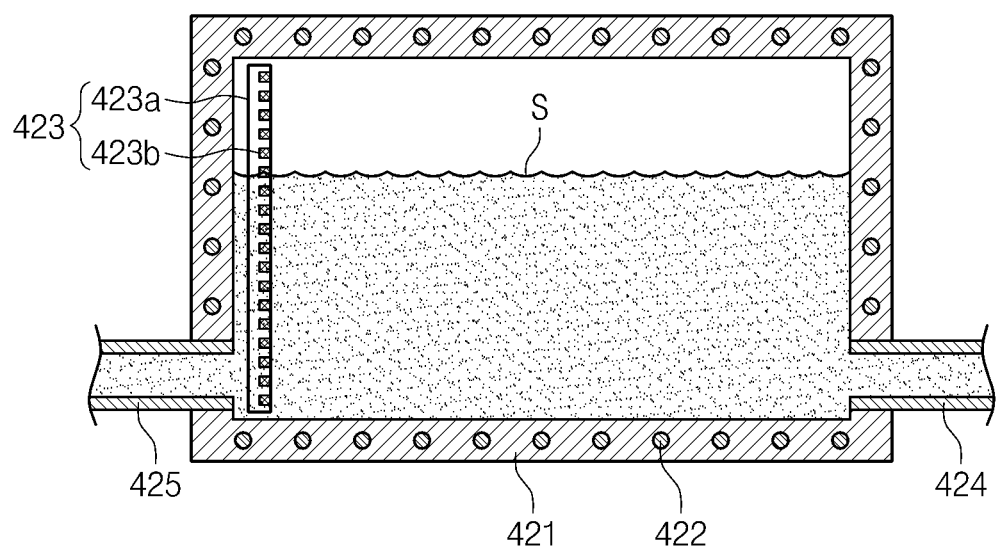
FIG. 6 is a cross sectional view illustrating a fluid storage part of FIG. 1.

FIG. 6 is a cross sectional view illustrating a fluid storage part of FIG. 1. Referring to FIGS. 1 and 6, the fluid storage part 420 includes a storage tank 421, a cooler 422 and a flow measurement part 423.

A space is formed inside the storage tank 421. Liquefied dry fluid is stored in the inside of the storage tank 421. Pipes 424 and 425 are connected to a front end and a back end of the storage tank 421 respectively. The pipes 424 and 425 may be connected to a lower portion of the storage tank 421. A dry fluid of liquid state flows into the storage tank 421 through the pipe 424 connected to the back end of the storage tank 421. A dry fluid of liquid state is discharged through the pipe 425 connected to the front end of the storage tank 421.

The cooler 422 is buried in the storage tank 421. The cooler 422 may be buried in walls of the storage tank 421. The cooler 422 cools the inside of the storage tank 421 to maintain the dry fluid in a liquid state. The cooler 422 may be provided in the form of a pipe in which a path through which refrigerant flows is formed and may have a similar configuration as described with respect to cooling member 313.

The flow measurement part 423 measures a flow of dry fluid stored in the storage tank 421. The flow measurement part 423 measures a height of a level S of the dry fluid stored in the storage tank 421. The flow measurement part 423 includes a rod 423a and a plurality of sensors 423b. The rod 423a is located inside the storage tank 421 and a lengthwise direction of the rod 423a may extend vertically to be parallel to an up and down direction. The sensors 423b are disposed on rod 423a, each one at a different height along a lengthwise direction of the rod 423a. The sensors 423b may detect the dry fluid using an ultrasonic wave. A height of the level S of the dry fluid can be judged through a location of the highest sensor 423b on rod 423a that detected the dry fluid. Alternative sensors may be used. For example, the sensors 423b may be contact sensors and detect the dry fluid using a contact method.

The auxiliary fluid supply part 430 supplies the same kind of fluid as the dry fluid stored in the fluid storage part 420. The auxiliary fluid supply part 430 includes an auxiliary fluid storage part 431, an auxiliary fluid supply line 432, a refinement part 433 and a pump 434.

The auxiliary fluid storage part 431 stores an auxiliary fluid. The auxiliary fluid supply line 432 connects the auxiliary fluid storage part 431 and the liquefier 410 and supplies an auxiliary fluid stored in the auxiliary fluid storage part 431 to the liquefier 410. The refinement part 433 and the pump 434 are installed in the auxiliary fluid supply line 432. The refinement part 433 is installed between the auxiliary fluid storage part 431 and the pump 434. The refinement part 433 may be configured to remove impurities included in the auxiliary fluid. The refinement part 433 may include a filter. The refinement part 433 may comprise a filter to remove carbon included in the auxiliary fluid and a filter to remove particles included in the auxiliary fluid.

The pump 434 increases a pressure to a high pressure before an auxiliary fluid is supplied to the liquefier 410. The pump 434 increases a pressure of the auxiliary fluid so that the pressure of the auxiliary fluid corresponds to a pressure of the dry fluid being supplied to the liquefier 410.

The auxiliary fluid is liquefied in the liquefier 410, and then is stored in the fluid storage part 420.

The control part 440 controls the auxiliary fluid supply part 430 so that a fixed flow of dry fluid is stored in the storage tank 421. An internal pressure of the storage tank 421 varies depending on the fixed flow of dry fluid stored in the storage tank 421. Thus, it is desirable that a fixed flow of dry fluid is stored in the storage tank 421. If the flow of dry fluid stored in the storage tank 421 is less than the previously set up flow, a shortage is covered by a supply of auxiliary fluid. The control part 440 receives a height of the level S of the dry fluid measured in the fluid measurement part 423. If the height of the level S of the dry fluid is lower than a predetermined height (e.g., a previously selected fixed height), the control part 440 controls the auxiliary fluid supply part 430 to supply additional dry fluid to the storage tank 421. The height of level S of the dry fluid thus increases to the predetermined height by supplying the auxiliary dry fluid.

A dry fluid stored in the storage tank 421 is supplied to the substrate dry part 100 through the pipe 425.

The high pressure pump 450 and the reserve unit 460 are installed in the pipe 425 between the fluid storage part 420 and the substrate dry part 100. The high pressure pump 450 increases and maintains the dry fluid above a critical pressure and the reserve unit 460 heats the dry fluid above a critical temperature using a heater (not shown). The dry fluid is converted into a supercritical state while passing through the high pressure pump 450 and the reserve unit 460. A heater jacket (not shown) may be provided to a pipe 425a between the reserve unit 460 and the substrate dry part 100. The heater jacket may heat (e.g., maintain and/or increase temperature of) the dry fluid to maintain a supercritical state while the dry fluid moves to the substrate dry part 100.

Figure 7:
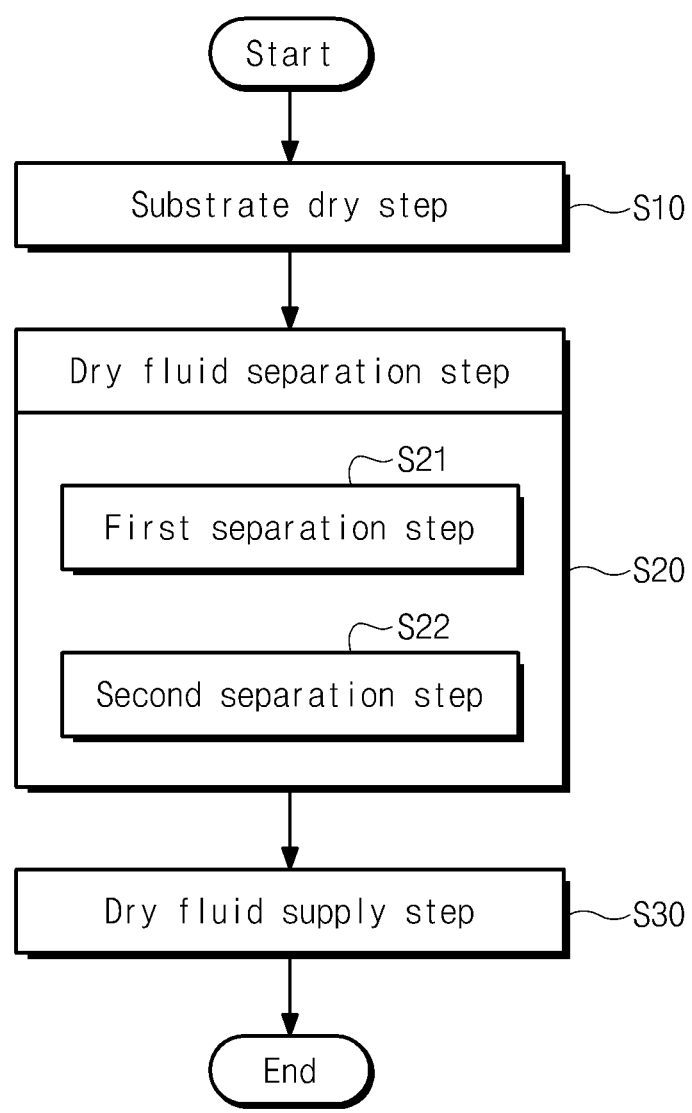
FIG. 7 is a flow chart illustrating a fluid supply method for treating a substrate in accordance with certain embodiments of the inventive concept.

A method of supplying a fluid using the fluid supply system for treating a substrate described above is described. FIG. 7 is a flow chart illustrating a method of manufacturing, comprising a fluid supply method for treating a substrate in accordance with certain embodiments of the inventive concept. The substrate may be a semiconductor substrate, such as a semiconductor wafer. The semiconductor substrate and/or semiconductor wafer may be being processed in a manufacturing method to produce semiconductor chips, such as memory chips, processor chips, communication IC's, etc. The semiconductor substrate/wafer may have just been subjected to a patterning process as part of steps to produce and/or connect integrated circuits within and/or on the substrate/wafer. For example, in a method of manufacturing an integrated circuit semiconductor chips, a layer may be formed on a substrate. The layer may be patterned (e.g., by forming a mask, e.g., by photolithography, and selectively etching the layer through the mask). The resulting structure including the patterned layer may then be cleaned, rinsed and dried. Drying the rinsed patterned layer on the semiconductor layer may be performed by providing supercritical carbon dioxide (or other drying fluid) to the semiconductor wafer within a processing chamber, creating a mixed fluid of supercritical carbon dioxide and rinse solution within the processing chamber. The supercritical carbon dioxide (or other drying fluid) may be recycled as described herein.

Referring to FIG. 7, the fluid supply method for treating a substrate includes a substrate dry step S10, a dry fluid separation step S20 and a dry fluid supply step S30. The substrate dry step S10 may supply a dry fluid to dry a rinse solution on the substrate. The dry fluid separation step S20 retrieves a mixed fluid in which the dry fluid and the rinse solution were mixed with each other in the substrate dry step S10 and separates the dry fluid from the retrieved mixed fluid. The dry fluid supply step S30 resupplies the dry fluid separated from the mixed fluid to the substrate. The substrate dry step S10, the dry fluid separation step S20 and the dry fluid supply step S30 are sequentially performed.

Referring to FIGS. 1 and 2, the substrate dry step S10 is performed on a substrate W on which a cleaning process and a rinse process are completed. The substrate W on which a cleaning process and a rinse process are completed in the substrate cleaning part 11 is transferred to the inside of the process chamber 110 by the substrate transfer part 12. The substrate W on which a rinse solution is doped is put on the substrate support member 120. A dry fluid of supercritical state is supplied to the process chamber 110 of which the inside is sealed through the supply port 130. The dry fluid diffuses into the inside of the process chamber 110 and an internal pressure of the process chamber 110 increases. The internal pressure of the process chamber 110 may be a critical pressure of the dry fluid so that the dry fluid is in a supercritical state within the process chamber 110 and the dry fluid dissolves a rinse solution doped on the substrate W. The mixed fluid in which the dry fluid and the rinse solution are mixed with each other is retrieved and may be supplied to the dry fluid separation part 20 through the fluid supply pipe 140.

The dry fluid separation step S20 includes a first separation step S21 and a second separation step S22.

In the first separation step S21, the mixed fluid is decompressed to a second pressure lower than a first pressure to phase-change the dry fluid to a gas state while allowing the rinse solution to have a liquid state. Rinse solution is thus initially separated from the dry fluid. Referring to FIGS. 1 and 3, a pressure of the mixed fluid is lowered as the mixed fluid expands and a pressure of the mixed fluid is reduced to the second pressure while the mixed fluid is discharged within separation tank 210. In this process, an internal temperature of the separation tank 210 may be lowered. The heater 240 heats the separation tank 210 to maintain the internal temperature of the separation tank 210, for example, at a room temperature. Under the aforementioned condition, the dry fluid is evaporated from a rinse solution having a liquid state. The liquid rinse solution gathers at a bottom of the separation tank 210 due to gravity, and then is discharged to the outside through the discharge pipe 221. The gas state dry fluid is discharged through the retrieve pipe 230 to be supplied to the second separation part 300.

In the second separation step S22, the dry fluid received from separation tank 210 is passed through an absorbent to further separate any remaining rinse solution or other material from the dry fluid. Referring to FIGS. 1, 4 and 5, the received dry fluid is supplied to the first absorption unit 310 by a control of the fluid supply control part 340. The dry fluid passes through the absorbent 312 provided to the absorption container 311. The rinse solution included in the dry fluid is absorbed onto a surface of the absorbent 312 while the dry fluid passes through the absorbent 312. Heat may be generated when the rinse solution is absorbed onto a surface of the absorbent 312. The cooling member 313 cools (e.g., removes heat from) the inside of the absorption container 311 to prevent an internal temperature of the absorption container 311 from rising. The dry fluid from which additional rinse solution is separated is discharged through the discharge pipe 350. The detector 360 measures purity of the dry fluid being discharged through the discharge pipe 350. Data measured in the detector 360 is provided to the control part 380. When impurities are detected from the dry fluid, the control part 380 controls the fluid supply control part 340 so that the dry fluid is supplied to the second absorption unit 320.

The dry fluid discharged through the discharge pipe 350 sequentially passes through the pump 370 and the liquefier 410. A pressure of the dry fluid is changed to a high pressure by the pump 370. A pressure of the dry fluid increases to reach a pressure of liquefaction. The dry fluid is cooled to a temperature that can maintain a liquid state under the above pressure condition by the liquefier 410. The liquefied dry fluid is stored in the fluid storage part 420.

Referring to FIGS. 1 and 6, the flow measurement part 423 measures a flow of the dry fluid stored in the storage tank 421. The measured data is provided to the control part 440. When the flow of the dry fluid stored in the storage tank 421 is less than the previously set up flow value, the control part 440 supplies auxiliary fluid through the auxiliary fluid storage part 431. The auxiliary fluid stored in the auxiliary fluid storage part 431 sequentially passes through the refinement part 433, the pump 434 and the liquefier 410 to be stored in the storage tank 421. Impurities of the auxiliary fluid are removed while passing through the refinement part 433. A pressure of the dry fluid is changed into a high pressure while passing through the pump 434. The dry fluid is cooled while passing through the liquefier 420 to be converted into a liquid state. The dry fluid is stored in the storage tank 421 in a liquid state.

The dry fluid stored in the storage tank 421 is resupplied to the substrate dry part 100. The dry fluid sequentially passes through the high pressure pump 450 and the reserve unit 460 through the pipe 425 to be supplied to the substrate dry part 100. A pressure of the dry fluid is increased above a critical pressure by the high pressure pump 450 and the dry fluid is heated by the reserve unit 460 to remain above a critical temperature. The dry fluid is converted into a supercritical state to be supplied to the substrate dry part 100.

Figure 8:
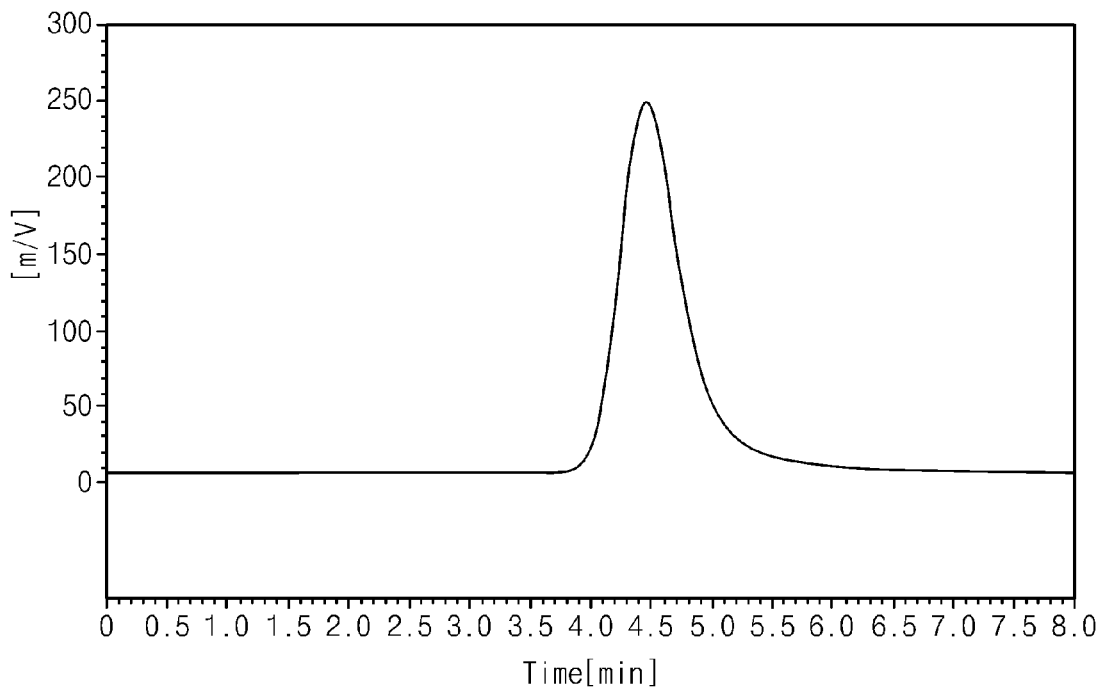
FIG. 8 is a graph showing components included in a fluid separated from a first separator.
Figure 9:
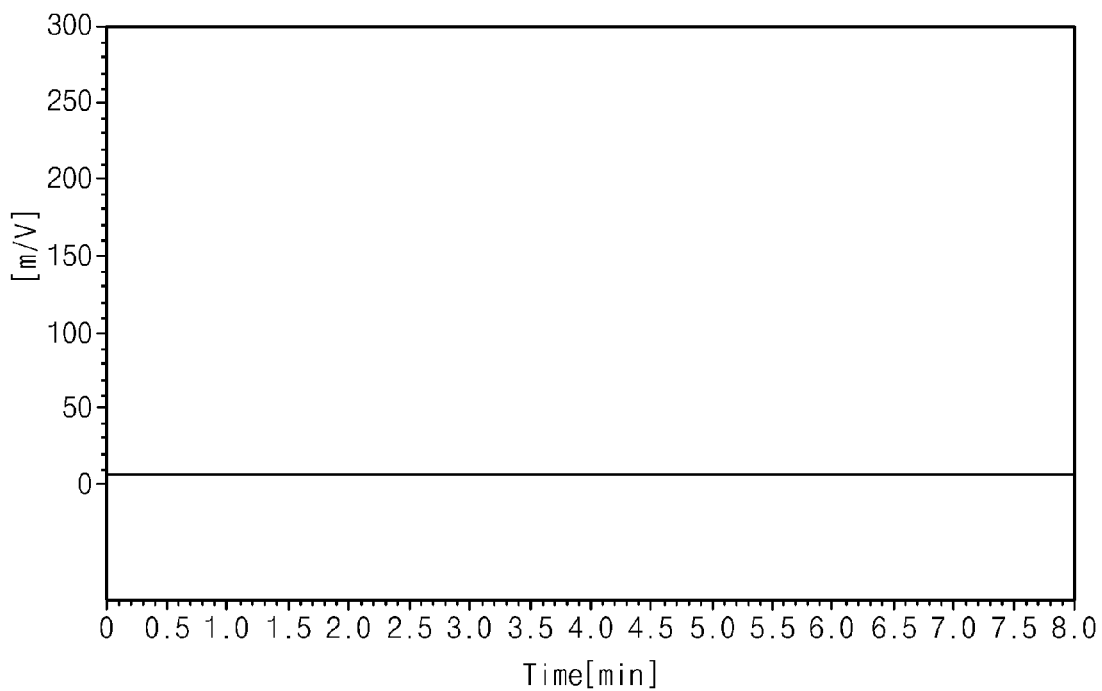
FIG. 9 is a graph showing components included in a fluid sequentially separated from a first separator and a second separator.

FIG. 8 is a graph showing components included in a fluid separated from a first separator. FIG. 9 is a graph showing components included in a fluid sequentially separated from a first separator and a second separator. The fluid is component-analyzed through a column and a time taken to detect components is different according to components included in the fluid. In this experiment, isopropyl alcohol is used as a rinse solution and the experiment is set so that the isopropyl alcohol is detected at 4~5 minute section. A horizontal axis of the graph represents a time that component analysis is performed and a vertical axis of the graph represents mass per unit volume (m/V).

Referring to FIG. 8, a curve graph is represented at about 4~5.5 minute section after a component analysis of the fluid separated from a first separator begins. We can see in the graph that about 240 m/V is detected at about 4.5 minute. This means that isopropyl alcohol is not efficiently separated in the first separator.

Referring to FIG. 9, in a component analysis of the fluid sequentially separated in the first and second separators, a specific graph is not represented at about 4~5 minute section. This means that a flow of isopropyl alcohol being detected is remarkably lower than an experiment example of FIG. 8.

The dry fluid separation part of the inventive concept sequentially includes the first separator and the second separator and thereby a separation efficiency of rinse solution may be improved.

According to some embodiments of the inventive concept, by reprocessing and reusing a dry fluid used in a dry process, a using efficiency of dry fluid is improved.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A fluid supply system for treating a substrate comprising:
   a process chamber configured to supply a supercritical fluid to a substrate to dry a rinse solution adhered to the substrate;
   a supercritical fluid separation unit configured to receive a mixed fluid comprising a mixture of the supercritical fluid and the rinse solution from the process chamber and configured to separate at least a portion of the supercritical fluid from the mixed fluid; and a supercritical fluid supply part configured to resupply the separated supercritical fluid to the process chamber, wherein the mixed fluid is maintained at a first pressure in the process chamber, and wherein the supercritical fluid separation unit comprises:

a first separation part configured to reduce the pressure of the mixed fluid to a second pressure lower than the first pressure to change the phase of the supercritical fluid included in the mixed fluid to a phase different from the rinse solution and to perform an initial separation of the phase-changed supercritical fluid from the rinse solution to obtain an initially separated phase-changed supercritical fluid; and a second separation part configured to receive the initially separated phase-changed supercritical fluid and to pass the initially separated phase-changed supercritical fluid through an absorbent to perform a secondary separation of the supercritical fluid from the rinse solution, wherein the second separation part comprises:

a first absorption container in which a first portion of the absorbent is provided;

a second absorption container in which a second portion of the absorbent is provided;

a retrieve pipe configured to retrieve the supercritical fluid separated from the first separation part, wherein one end of the retrieve pipe is connected to the first separation part and the other end is split into a first outlet and a second outlet and connected to the first absorption container with the first outlet and the second absorption container with the second outlet;

a fluid supply control part configured to selectively supply the supercritical fluid to one of the first absorption container and the second absorption container, the fluid supply control part being installed at the retrieve pipe;

a detector configured to measure purity of the supercritical fluid being discharged from the first absorption container and the second absorption container; and a controller configured to analyze impurities of the supercritical fluid in response to data provided from the detector and to control the fluid supply control part so that the supercritical fluid is supplied to one of the first and second absorption containers when it is determined that the other of the first and second absorption containers has unacceptable impurities.

2. The fluid supply system for treating a substrate of claim 1, wherein the absorbent comprises zeolite.

3. The fluid supply system for treating a substrate of claim 1, wherein the first separation part comprises:

a separation tank including an interior space to receive the mixed fluid from the process chamber;

a discharge pipe having an inlet connected to a bottom surface of the separation tank to remove the rinse solution separated from the supercritical fluid to an outside of the separation tank;

a retrieve pipe configured to retrieve the supercritical fluid separated from the rinse solution, a retrieve inlet of the retrieve pipe being connected to the separation tank at a higher position than the inlet of the discharge pipe; and a heater configured to heat the inside of the separation tank, the heater being installed in the separation tank.

4. The fluid supply system for treating a substrate of claim 1, wherein the second separation part further comprises:

a cooling member configured to cool the inside of the absorption container.

5. The fluid supply system for treating a substrate of claim 1, wherein the supercritical fluid supply part comprises:

a liquefier configured to liquefy the supercritical fluid separated in the second separation part;

a storage tank configured to receive and to store the liquefied supercritical fluid, the storage tank being connected to the liquefier; and a cooler configured to remove heat from the inside of the storage tank.

6. The fluid supply system for treating a substrate of claim 5, wherein the supercritical fluid supply part further comprises:

a meter configured to monitor an stored supercritical fluid stored in the storage tank; and an auxiliary fluid supply part configured to supply auxiliary supercritical fluid to the storage tank if the stored supercritical fluid is less than a predetermined amount.

7. The fluid supply system for treating a substrate of claim 6, wherein the auxiliary fluid supply part comprises:

an auxiliary fluid storage unit storing the auxiliary supercritical fluid;

an auxiliary fluid supply line connecting the auxiliary fluid storage unit and the liquefier and configured to supply the auxiliary supercritical fluid to the liquefier; and a refinement part configured to remove impurities included in the auxiliary supercritical fluid supplied to the liquefier, the refinement part being installed at the auxiliary fluid supply line.

8. The fluid supply system for treating a substrate of claim 5, wherein the supercritical fluid supply part further comprises:

a supply pipe connecting the storage tank and the process chamber and configured to supply the supercritical fluid stored in the storage tank to the process chamber; and a pump increasing a pressure of the supercritical fluid to a first pressure, the pump being installed at the supply pipe.

9. The fluid supply system of claim 1, further comprising:

a substrate cleaning part configured to perform a cleaning process and a rinse process on the substrate; and a substrate transfer part configured to transfer the substrate from the substrate cleaning part to the process chamber, wherein the substrate transfer part is disposed between the substrate cleaning part and the process chamber.

10. The fluid supply system of claim 9, wherein the substrate transfer part is configured to transfer the substrate from the substrate cleaning part to the process chamber after the rinse process on the substrate is performed.

* * * * *